United States Patent [19]

LaPlante

[11] Patent Number: 4,678,908

[45] Date of Patent: Jul. 7, 1987

[54] ZERO REFERENCE GENERATING METHOD AND APPARATUS FOR OPTICAL ENCODERS

[75] Inventor: Dale LaPlante, Goleta, Calif.

[73] Assignee: BEI Electronics, Inc., San Francisco, Calif.

[21] Appl. No.: 678,499

[22] Filed: Dec. 5, 1984

Related U.S. Application Data

[63] Continuation-in-part of Ser. No. 517,322, Jul. 25, 1983, Pat. No. 4,602,155.

[51] Int. Cl.[4] .............................................. G01D 5/34
[52] U.S. Cl. ........................... 250/231 SE; 250/237 G
[58] Field of Search ..................... 250/231 SE, 237 G; 356/395, 374; 340/347 P; 33/125 A, 125 C

[56] References Cited

U.S. PATENT DOCUMENTS

| | | | |
|---|---|---|---|
| 3,187,187 | 6/1965 | Wingate | 250/231 SE |
| 3,749,925 | 7/1973 | Hertrich | 250/231 SE |
| 3,982,106 | 9/1976 | Stutz | 250/237 G |
| 4,451,731 | 5/1984 | Leonard | 250/231 SE |
| 4,477,189 | 10/1984 | Ernst | 250/237 G |

Primary Examiner—David C. Nelms
Attorney, Agent, or Firm—Limbach, Limbach & Sutton

[57] ABSTRACT

An encoder for providing positional information about a moveable member comprising code member means couplable to the moveable member for movement with the moveable member, reference means positioned to be stationary relative to the code member, an index sequence positioned on the code member, a mask sequence positioned on the reference member means, and means for detecting the degree of registration between the index sequence and the mask sequence, wherein the index sequence and the mask sequence include a plurality of building block patterns that are separated by predetermined spacings.

14 Claims, 12 Drawing Figures

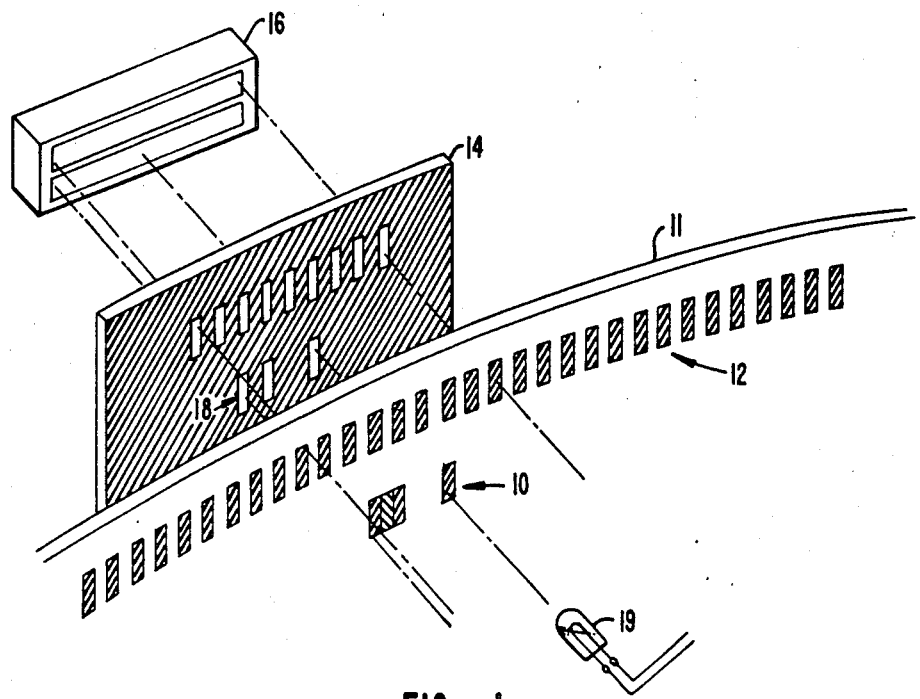
FIG._1.
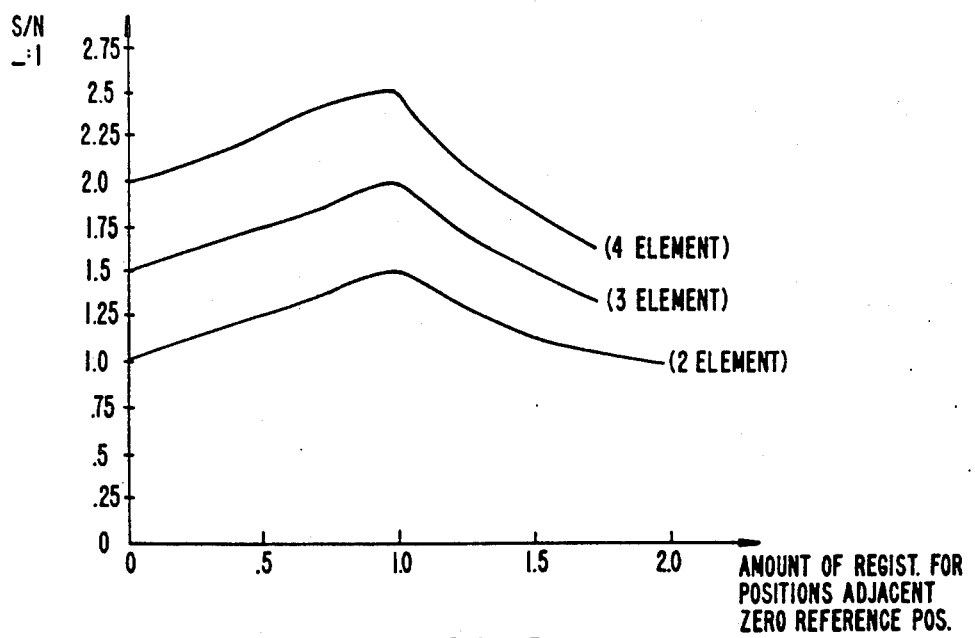
FIG._5.

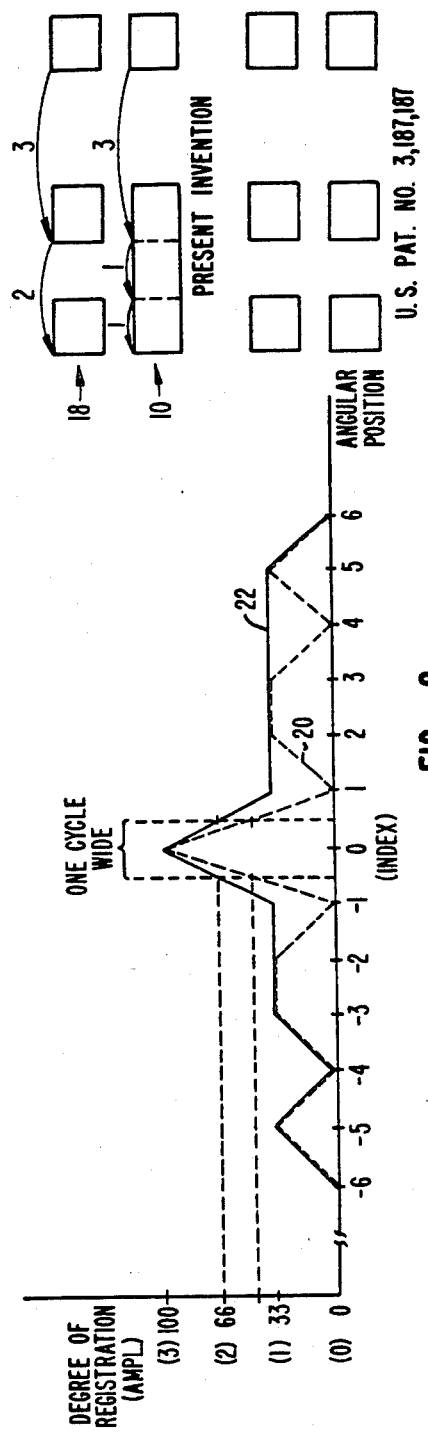
FIG.—2.
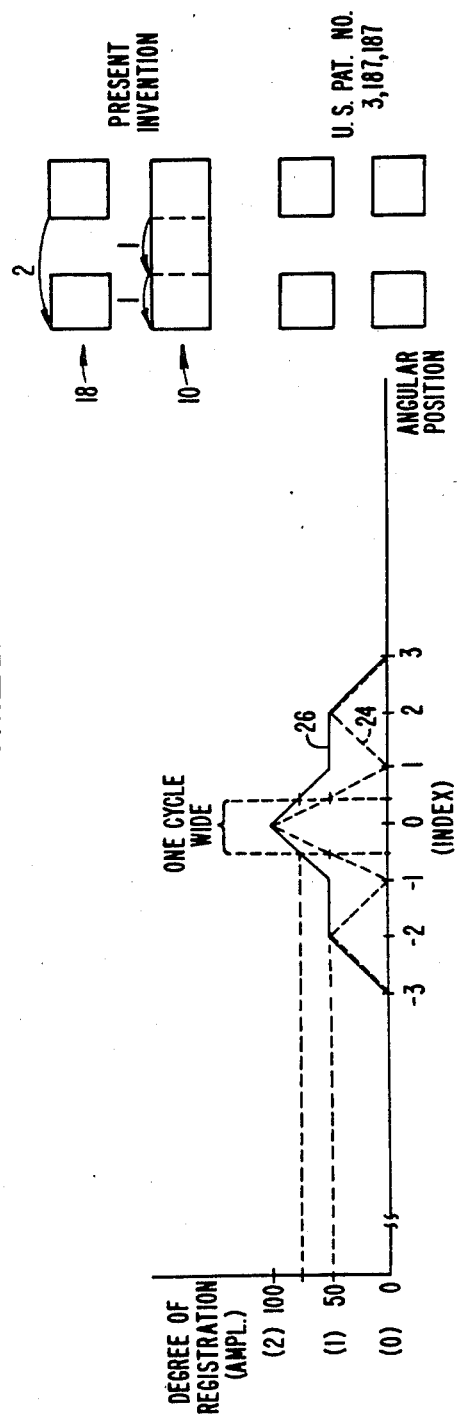
FIG.—3.

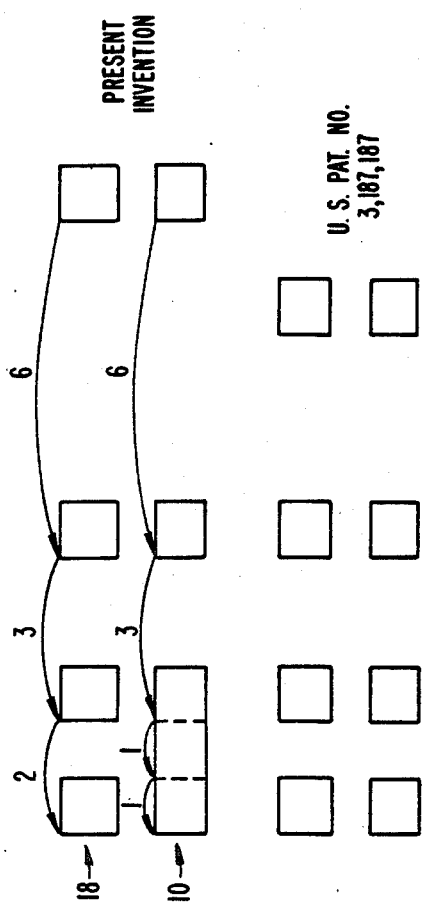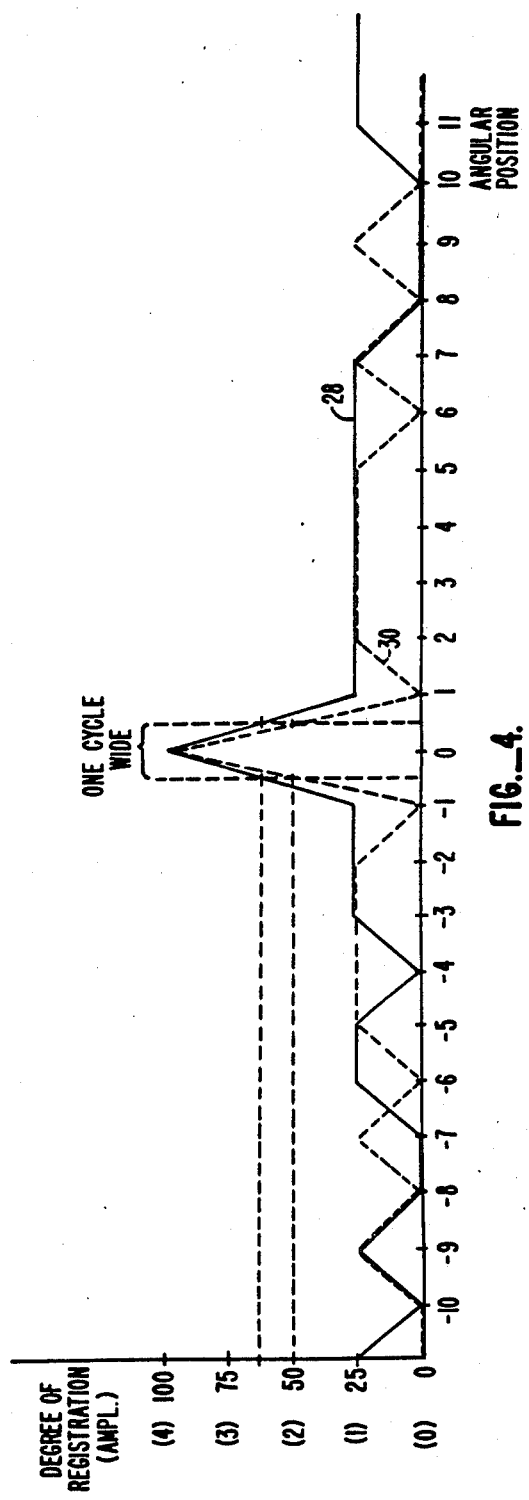
FIG. 4.

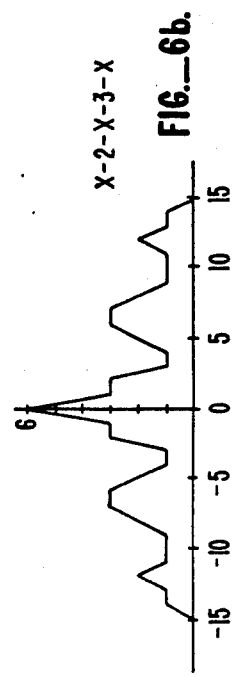

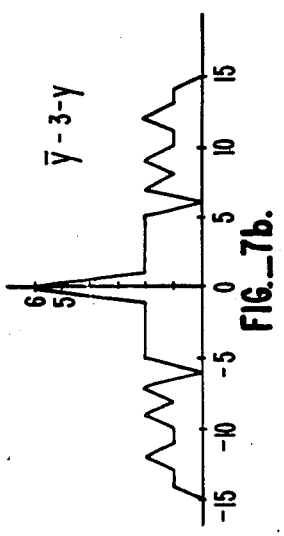

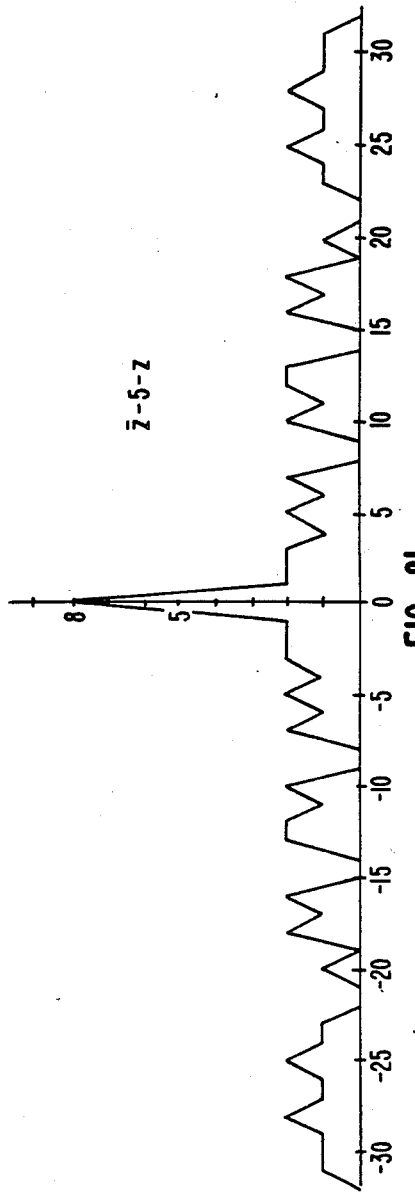

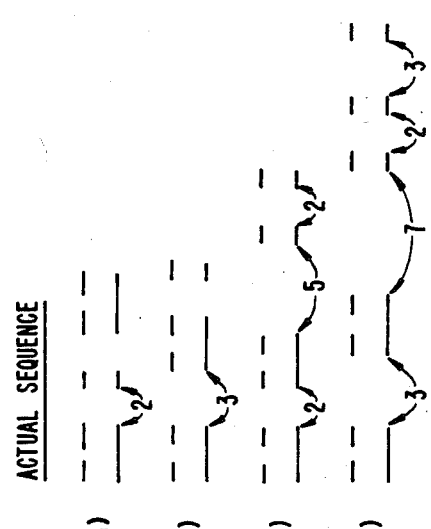
FIG._9. MIXED PATTERNS

ZERO REFERENCE GENERATING METHOD AND APPARATUS FOR OPTICAL ENCODERS

This is a continuation in part application of U.S. patent application Ser. No. 517,332 filed July 25, 1983, now U.S. Pat. No. 4,602,155.

TECHNICAL FIELD

The present invention is directed to a method and apparatus for generating a reference signal from a rotating body and, in particular, to a method and apparatus for generating an index mark or zero reference signal in an optical encoder.

BACKGROUND ART

Optical encoders are typically used to provide positional information for rotating shafts. To do this, the optical encoder provides a code disc which is attached for rotation to the shaft of interest. The code disc includes code elements which are positioned circumferentially on the disc. Detector means are provided which are fixed in position with respect to the rotating code disc and which are positioned in registration with the path of the code elements on the disc. As the code disc is rotated by the rotating shaft, the code elements are translated with respect to and through various degrees of registration with the detector means. In absolute encoders, there is a unique set of code elements assigned to each angular position of the disc. Thus each angular position is uniquely identified, and the detector means outputs a signal representative of the code elements currently in registration with the detector means.

With incremental encoders, the code elements for each angular position are the same; however, the detector means count the number of code elements which are caused to pass in registration with the detector means when the code disc is rotated, so that the total number of elements counted for a given rotation of the disc is proportional to the number of angular positions through which the code disc was rotated.

Due to the lack of a unique code for each angular position of incremental encoder code discs, an index signal is often required to be generated to indicate some reference point on the disc so that counting means in the detector can have a starting point to which the count can be referenced. This index signal is typically generated by a set of code elements which are separate from the code elements in the main track of the code disc.

The typical detector means include a mask which bears the same index sequence of code elements as found on the code disc, as well as means for detecting the degree of registration between the code disc index sequence and the mask index sequence of code elements. Occasionally, a single code element is used as the index mark. However, it has been found that a multiplicity of code elements which have been arranged in special sequences are required to provide an index signal of sufficient resolution and amplitude to be satisfactory for a majority of optical encoder applications.

In order to detect the registration of the sequences, the code disc and mask are positioned between a light source and a photodetector. The index sequence on the code disc and the mask index sequence collectively modify the light which impinges upon the photodetector from the light source. Typically, no light is permitted to pass to the photodetector through the code disc and the mask when the respective sequences are totally out of registration with one another. Similarly, a maximum amount of light passes to the photodetector when there is maximum registration between the code disc index sequence and the mask index sequence.

Preferably, for all other degrees of registration the amount of light which is permitted to pass through to the photodetector is kept small. This, coupled with the requirement that the angular resolution provided by the index or reference signal be at least as precise as the angular position resolution provided by the code elements in the main track of the code disc, results in an index signal which is usually the weakest signal from the optical encoder. Thus, special techniques have been employed to enhance the signal characteristics of this index signal. Illustrative of these is U.S. Pat. No. 3,187,187 to Wingate. In the patent to Wingate, a special index sequence of slits is positioned transversely on the code disc and apart from the main track of the code disc. The sequence bridges several consecutive angular positions of the code disc. A mask, having a pattern identical to the index sequence is employed in conjunction with a detector. The detector detects the degree of registration between the mask and the index sequence as the disc rotates.

The physical distribution of the code elements in the index sequence and mask sequence is selected so that the degree of registration between individual elements is at a maximum when the code disc is at the index or zero reference position. For all other positions of the code disc, the degree of registration is below a designated level, typically one element.

In order to accomplish this, the code elements in the index sequence are arranged to have a selected spacing therebetween determined by a specific mathmetical relationship. In U.S. Pat. No. 3,187,187, this mathmetical relationship is defined in terms of numerical series; namely, 2, 3, 4, 6, 8, 12, 16, 24, etc. or 2, 3, 6, 8, 11, 16, 17, 20, 22, 24, etc., in which the numbers represent the spacing (in terms of code element widths) between the leading edges of successive code elements. Under this arrangement, no spacing between any two successive code elements is equal to any other spacing or to the sum of any group of immediately successive spacing.

When the above numerical series are employed, all angular positions of the code disc, except the index position, will exhibit a degree of registration between the mask sequence and the index sequence below some background registration level. At the index position of the code disc, the degree of registration is at a maximum and the detector output is large. However, the degree of registration is always zero for positions to either side of the index position. Although this further maximizes the change in detector output magnitude between the index or zero reference position and the positions adjacent thereto, there are certain disadvantages to this configuration.

It has been found that, despite this large output magnitude signal the signal-to-noise ratio therefor is often unsatisfactory. The relative magnitudes of the degree of registration for the index position and for the background registration provide a signal-to-noise ratio which is indicative of the quality of the index signal being generated.

In practice, a "safety factor" is applied in using the zero reference signal from the detector in the generation of an index signal at the encoder output. The safety factor takes into consideration variation of the signal over temperature, component aging, and different operating conditions of the encoder. For example, due to frequency response limitations in the detector means, the higher the speed at which the optical encoder is operated, the lower the output of the detector means will be. Additionally, the period-width of the index signal is related to the resolution of the encoder, such that for higher resolution encoders smaller period-width index signals are required.

Typically, the "safety factor" is implemented in an optical encoder by selecting a threshold level on the index signal waveform where the waveform is one code element wide. It is to be understood that the threshold levels selected are a matter of design choice which involves the trade-off of performance of the encoder in other respects. Thus, it is not a requirement that the threshhold level be set at the one-code-element wide point in order to properly practice the present invention.

The above can be better understood by considering that the registration between a code element in the index sequence and one of the elements in the mask sequence proceeds from a state where the elements are initially out of registration with one another, through a state where registration increases until full registration is achieved, and then through a state of decreasing registration. Finally the elements fall out of registration with one another. The waveform for such a progression takes the shape of a triangle. The left side of the triangle occurs as the two elements first begin to come into registration with one another. The peak of the triangle occurs as the two elements are in full registration with one another, and the right side of the triangle occurs as the two elements are falling out of registration with one another. The one-code-element-wide point is selected symmetrically about the peak of the triangle to correspond to the points on the triangle where the triangle is as wide as one of the code elements, i.e. where movement along the curve between the points corresponds to the angular displacement of the code disc through a distance equal to the width of a code element.

It is to be understood that the height of the triangle is a function of the number of code elements in the index sequence. It is also to be understood that the width of the triangle is related to the width of the code elements.

In practice, the index sequences which are actually used to generate the index signal are limited in the number of elements which practicably can be used. This is because, as the number of elements in the index sequence increases, which corresponds to an increase in the physical area which must be monitored, there is a rapid decrease in the optical efficiency of the detector. A large number of elements in the index sequence requires large area sensors. In turn, large area sensors exhibit greater capacitance effects than detectors for smaller areas, hence a limited frequency response. This capacitance effect increases at a faster rate than the increase in signal-to-noise ratio due to more code elements.

A further limitation has been found regarding the minimum number of code elements which can be used. When the safety factor, as discussed above, is applied to selecting a threshold level on the registration waveform from the detector, it has been found that the signal-to-noise levels for a one or two element sequence configured according to the teachings of the patent to Wingate are unacceptable, and that the level for a three-element sequence is barely adequate.

DESCRIPTION OF THE INVENTION

These and other problems of the prior index signal generating means are overcome by the present invention of an improved optical encoder having a code disc supported for rotation on a stationary member wherein a zero reference signal is generated by comparing the degree of registration between a first set of indicia on the code disc and a second set of indicia fixedly positioned on the stationary member, wherein the first set of indicia include a first sequence of code elements which are staggered in positional relation with one another; and further wherein the second set of indicia include a second sequence of code elements which are staggered in positional relation to one another; and further wherein the degree of registration between the first sequence of code elements and the second sequence of code elements is at a maximum for a predetermined zero reference position of the code disc, and at or below a background registration level for all other angular positions of the code disc; and further wherein the code elements are arranged in each set so that the degree of registration for the angular position to either side of the zero reference position is greater than zero and no greater than the background registration level. Preferably, the degree of registration for the adjacent positions corresponds to the background registration level.

A disadvantage of the code element sequence as taught by the patent to Wingate or those taught in accordance with the present invention, is that the improvement offered by these sequences becomes less pronounced as the number of elements in the sequences increases. This is due to the requirement of wide area sensors for reading such sequences. With the longer sequences, the signal-slit pattern is so sparse that the resulting signal level, when viewed in light of the size of the sensor required to receive the signal, does not yield a usable result.

However, it has been found that the shorter sequences discussed above can be used as building blocks to form an index sequence from sequences of such building blocks. With such sequences, the optical patterns are such that large area sensors can be used with greatly improved efficiency over the earlier sequences. Thus, it has been found that the sequences of individual elements discussed above can themselves be used as building blocks for an index sequences. It has been found that a single pattern can be repeated at specific spacings to yield an index pattern which affords a substantial safety factor.

Alternatively, it has been found that different index patterns can be used as building blocks in a single index sequence to provide satisfactory results.

It has also been found that when a single pattern is used as a building block the pattern can be used in its normal order and also in its reversed order to provide a useable index sequence.

In applying these concepts, it is to be understood that a particular index pattern comprises two parts, a code disk component, positioned on the code disk, and a mask component, positioned on the mask. When an index sequence is built by repeating an index pattern (or using different index patterns), the corresponding code disk component and mask component are repeated (or combined) to form a code disk sequence and a mask sequence respectively. The two together form the index sequence.

It is, therefore, an object of the present invention to provide an improved optical encoder wherein the reference signal generating means generates an index signal corresponding to a reference point on the code disc and further wherein the signal generated for the angular positions of the code disc to either side of the reference position are at a level which is greater than zero and no greater than the background reference level of the reference generating means.

It is therefore an object of the present invention to provide an index sequence which is useable with large area sensors.

It is another object of the present invention to provide an index sequence which is constructed of a number of building block sequences.

It is a further object of the present invention to provide an index sequence in which a selected sequence of elements is repeated at designated intervals.

It is still a further object of the present invention to provide an index sequence in which a single pattern in utilized as a building block where such building block is used in the normal order as well as in a reverse order.

These and other objectives, features and advantages of the present invention will be better understood upon consideration of the following detailed description of certain preferred embodiments when taken in conjunction with the accompanying drawings.

BRIEF DESCRIPTION OF THE DRAWINGS

FIG. 1 illustrates the positioning of a light source, code disc, mask and detector in accordance with the present invention.

FIG. 2 is an illustrative comparison of the output signals of the reference generating means for a three-element sequence according to the present invention as compared to a three-element sequence of the prior art.

FIG. 3 is an illustrative comparison of the output signal from the reference generating means for a two-element sequence according to the present invention in comparison to a two-element sequence of the prior art.

FIG. 4 is an illustrative comparison of the output signal of the reference generating means for a four-element sequence according to the present invention as compared to a four-element sequence according to the prior art.

FIG. 5 is a plot of the signal to noise ratios provided for different amounts of adjacent position registration.

FIG. 6a illustrates index sequences which utilize a plurality of a two element pattern.

FIG. 6b illustrates the degree of registration obtained when two of the two element patterns in FIG. 6a are used to form an index sequence.

FIG. 7a illustrates a number of index patterns in which multiples of a three element pattern are used.

FIG. 7b illustrates the degree of registration obtained when the three element pattern is used twice in an index sequence.

FIG. 8a illustrates an index pattern formed when a four element pattern is used twice in an index sequence.

FIG. 8b illustrates the degree of registration obtained for the sequence of 8a.

FIG. 9 illustrates various index sequences formed from a mixture of different patterns.

DETAILED DESCRIPTION OF THE INVENTION

U.S. Pat. Nos. 3,187,187, and 3,995,156 are hereby incorporated by reference.

U.S. Pat. No. 3,995,156 is illustrative of a typical configuration for an optical encoder. Shown therein is a stationary member, such as a housing, a code disc, code elements arranged circumferentially on the code disc to form a main track, and photodetector means for detecting individual elements within the main track as the code disc is rotated past the detector means by the shaft of interest.

FIG. 1 illustrates a typical arrangement of the code sequence 10 employed to generate an index mark in relation to a main track 12, a mask 14, and detector means 16. As is apparent from U.S. Pat. No. 3,187,187 optical detector means can be employed to measure the degree of registration between the index sequence 12 on the code disc 11 and an identical sequence on the mask 14. In FIG. 1 the code disc 11 is illuminated by a light source 18 such that the degree of registration between the index sequence 12 on the code disc 11 and the sequence 18 on the mask 14 determines the amount of light which is permitted to fall onto detector means 16, such as a photodetector. The greater the degree of registration, the larger the photodetector output. Conversely, the smaller the degree of registration, the lower the photodetector output.

For purposes of the description provided herein, it is to be understood that optical detector means are employed to determine the degree of registration between the index sequence 10 and the mask sequence 18. However, it is also to be understood that the present invention is equally applicable to other detection means such as capacitive detection, magnetic detection, and the like.

Referring to FIG. 2, the waveform represented by the dotted line 20 is representative of the output signal from the detector means 16 for a three-element sequence, which is positioned on the code disc 11 and formed according to U.S. Pat. No. 3,187,187, as the sequence falls in and out of registration with an identical pattern in the mask. As can be seen from the figure, the signal output level is at a maximum, i.e., three units when the index position is reached.

In interpreting the waveforms shown in the figures, it is to be understood that the units of the horizontal scale correspond to units of angular position of the code disc which are referenced to an index or zero reference position of the code disc. The vertical scale represents units of registration (parenthesized) or the degree of registration, in percent. One unit of registration corresponds to the level out of the detector means 16 when only one element in the index sequence 10 and one element in the mask sequence 18 are in full registration with one another. For example, in FIG. 2, the maximum amplitude occurs at angular position zero (i.e. the index position) and has an amplitude which corresponds to three units. The bottom right hand portion of each figure illustrates the relative positions of the elements in the index sequence and the mask sequence when the code disc is in the index position. Thus, in FIG. 2 it can be seen that when the three element index sequence, constructed according to the patent to Wingate, is at the index position, there will be three code elements in full registration with one another and, thus, an amplitude of three units from the detector means.

From waveform 20 in FIG. 2, it can be seen that the background registration noise has an amplitude of one unit. In other words, for all angular positions of the code disc, except the index position, the registration of the index sequence with the mask sequence will have a magnitude which is equal to or less than one unit. Thus, from FIG. 2, it can be seen that for the non-index-position angular positions the degree of registration varies from between no registration at all to full registration between only one element in each sequence.

Preferably, the index sequence on the code disc and the index sequence in the mask are selected so that the background registration level is minimized. Theoretically, for index sequences in which the code elements are spaced according to some multiple of the width of the code elements used, there will be a background registration level of at least one unit. The index code sequences in the patent to Wingate are selected so that the background registration level is no greater than one unit. It is to be understood that, preferably, the index code sequences of the present invention are similarly selected so that the background registration level is no greater than one unit.

Also illustrated in waveform 20 of FIG. 2 is the threshold level which would be selected if a safety factor corresponding to one cycle width were desired. This threshold level will be one and one-half units. With a background registration level of one unit, this translates to a signal-to-noise ratio of one-and-a-half to one.

It has been discovered that this signal-to-noise ratio can be substantially improved by modification of the code sequence used in generating the index mark. In FIG. 2, the waveform 22, which is drawn with a solid line, illustrates the output waveform from the detector for the registration of the code sequences shown in the upper righthand corner of the figure. These sequences are formed according to the present invention. Waveform 22 has the same maximum value, and the same background registration level as the waveform for the three element code sequence of U.S. Pat. No. 3,187,187. However, upon comparison of the threshold levels for a one-cycle wide safety factor, it is readily apparent that the signal-to-noise ratio for waveform 22 has been improved substantially. From FIG. 2, it can be seen that the one-cycle wide level on waveform 22 has an amplitude of two units. Thus, the threshold of waveform 22 is twice as far above the background registration level as the threshold level for waveform 20.

It has been discovered that the reason for the lower signal to noise ratios when using the code sequences taught in the patent to Wingate, is that for the angular position to either side of the index position the index sequences taught always yield a zero registration. Thus, the corresponding waveform always returns to zero before increasing to the maximum registration level thereof.

According to the present invention, it has been determined that if the waveform does not return all the way to zero for the angular positions to either side of the index position, a substantially improved signal-to-noise ratio, i.e., a greater one-element-wide threshold level, is obtainable. In order to implement this discovery, the code patterns shown in the upper righthand corner of each of the figures have been invented. Note that, for FIGS. 2 and 3, while one of the code sequences is identical to that for the sequence taught in the patent to Wingate, the other code sequence includes an additional element which bridges two pre-existing elements. The result is that, for positions to either side of the maximum registration position, there will be a degree of registration corresponding to the background registration level, i.e. one unit, instead of zero registration.

It is to be understood that the sequences of the present invention can be used interchangeably on the code disc or in the mask. It is also to be understood that the patterns shown in the figures represent but one implementation of the present invention for the number of code elements shown therein.

There is an added benefit in providing an index sequence and mask pattern which produce the waveform 22 in FIG. 2. The magnitude rate of change (slewing rate), which the detector means is required to follow for accurate detection of the waveform, is reduced under the present invention. As can be seen from FIG. 2, the magnitude of waveform 22 changes one unit between the plus one or minus one angular position and the threshold level. In contrast, waveform 20 changes one and one-half units between the plus one or minus one angular position and the threshold for that waveform. Accordingly, the waveform in 22 can be handled more easily by the detector means than can waveform 20. This becomes important when high rotational velocities cause the frequency of the waveforms, and thus the magnitude rate of change thereof, to increase.

It has been found that implementing the index sequence according to the present invention provides the greatest amount of improvement over previous index sequences arrangement for lower numbers of elements in the index sequence.

Referring to FIG. 3, it can be seen that when using a two-element pattern implemented according to the present invention, a threshold which is one-half unit above the background registration level can be achieved. Recall that for the two-element pattern according to the patent to Wingate, in FIG. 3, waveform 24, the threshold level using the safety factor was at the background registration level. The two-element pattern implemented according to the patent to Wingate thus provides a signal to noise ratio of 1:1 and as such is of little practical value.

In accordance with the present invention, a threshold level is obtainable for a two element sequence which is comparable to that found in the three-element pattern of the patent to Wingate. Thus, the present invention provides in a two-element pattern a safety margin which is comparable to a three-element pattern implemented according to the patent to Wingate. See FIG. 3, waveform 26.

Again, it should be noted, in connection with FIG. 3, that the waveform 26 generated according to the present invention begins at the background registration level as the index or reference zero point is approached. In contrast, waveform 24, produced by the pattern according to the patent to Wingate, returns to zero for the angular position to either side of the index or zero reference position.

In accordance with the present invention the two-element sequence of the patent to Wingate is modified by adding a linking element in one of the sequences. See FIG. 3. This provides the no-transition-to-zero characteristic of waveform 26.

Referring to FIG. 4, waveforms for a four-element pattern are shown, along with the patterns implemented according to the patent to Wingate and according to the present invention. Waveform 28 is illustrative of the registration waveform for the code sequences configured according to the present invention, while waveform 30 represents the waveforms obtained for sequences configured according to the patent to Wingate. As can be seen from the figure, an improvement of one-half units in threshold level can be obtained under the present invention.

From an examination of the patterns, at the top of FIG. 4, it can be seen that the code sequences according to the present invention differ from that taught in the patent to Wingate in two ways. First of all, an additional linking element has been added as in the case of the two- and three-element patterns. Additionally, the pattern has been modified so that the rightmost elements have been moved outward by two positions. One disadvantage of the four-element pattern, as constructed according to the present invention, is that a larger area detector is required over that in the patent to Wingate. However, the one-half unit increase in threshold level often outweighs this disadvantage.

From the waveforms in FIGS. 2 through 4, it can be seen that a substantial improvement in the threshold level of an index signal can be obtained by providing an index sequence and mask pattern which are constructed in a manner similar to that taught in the patent to Wingate, but which have been modified so that the degree of registration between the index sequence and the mask pattern does not return to zero for positions to either side of the index or zero reference position. Preferably, the degree of registration for the adjacent angular positions is substantially equal to the background registration level. In the preferred embodiment of the present invention, the same index sequence and mask sequence as taught in the patent to Wingate are used, except that one of the sequences is modified to have an added linking element which links the two elements in the modified sequence which are closest to one another.

FIGS. 2, 3 and 4 illustrate the preferred implementation of 3 element, 2 element and 4 element index sequences in accordance with the present invention. Using the terminology of the patent to Wingate, these sequences can be expressed as follows: (1) three element sequence—(2, 3) and (1, 1, 3); (2) two element sequence—(1) and (1, 1); (3) four element sequence—(2, 3, 6) and (1, 1, 3, 6), wherein each number represents the leading-edge to leading-edge distance between consecutive code elements in the sequence in terms of units of code element width.

It is to be noted that, while the code disc index sequence and the mask index sequence in the patent to Wingate are identical, the code disc and mask sequences of the present invention are different. In the preferred embodiment, an additional code element is added to one of the sequences.

Thus, in accordance with the present invention, the 3 element sequence includes two sequences: a sequence in which the leading edge of the second element is two units away from the leading edge of the first element, and in which the leading edge of a third element is three units away from the leading edge of the second element; and a sequence in which the leading edge of the second element is one unit away from the leading edge of the first element, in which the leading edge of a third element is one unit away from the leading edge of the second element, and in which the leading edge of a fourth element is three units away from the leading edge of the third element.

The configuration for the two-element and four-element sequences of the present invention can be described in a similar manner.

It is to be understood that other code sequences which implement the teaching of the present invention exist, and that such sequences, so long as they provide a degree of registration for positions adjacent to the index or zero reference position which do not return to zero will be satisfactory.

It is also to be understood that some improvement can be realized in the signal to noise ratio for the index signal of an optical encoder in accordance with the present invention where the degree of registration for positions adjacent the index position of the disc fall anywhere within the range which is greater than zero and no greater than the background registration level.

It should also be recognized that the amount of registration for positions adjacent to the zero reference position can be greater than the background registration level and still provide an improvement over the prior art. This is demonstrated in FIG. 5 wherein the signal to noise ratio is plotted for adjacent-position levels which are greater than the background registration level. Curves for a two-element, a three-element and a four-element code sequence are provided. For all of the curves, the points on the vertical axis represent the signal to noise ratio provided when the patterns of the patent to Wingate are used. Each of the curves represents the signal to noise ratio provided when the registration level for adjacent position ranges from first greater than zero to approximately two units. The bold face portions correspond to signal to noise ratios which are greater than that provided by the patterns of the patent to Wingate. The peaks of the curves represent the levels provided by the sequences of the preferred embodiment of the present invention in FIGS. 2 through 4. While the other bold face portions provide levels which are degraded from the preferred embodiment levels, these levels are nonetheless an improvement over the prior art. These other levels can be realized by such techniques as changing the pitch, i.e., separation between elements increasing the vertical dimension of certain of the code elements, or the like.

The improved performance in optical encoders provided by the present invention can be seen upon considering the performance of an encoder utilizing the three-element sequence of the present invention. When a single-element index mark has been found to provide a frequency response parameter of approximately 20 KHz. When a 3-element sequence according to the present invention is utilized, a 100 KHz parameter is not unrealistic. In other words, a five-fold improvement can be realized.

The larger threshold values available under the present invention also permit improved performance from the detector means. It is well-known that, for the low-gain amplifiers typically utilized in the detectors, the phototransistors therein have lower gain for lower collector currents. The low threshold levels normally available from prior index mark generating schemes dictate that the detector phototransistors be operated at low collector current levels. When the index sequence of the present invention is utilized, a higher threshold level is provided. As such, higher collector currents will be present and the operating point of the phototransistors can be increased to enhance the gain of the phototransistors. As such, a substantial increase in the performance of the phototransistor can be realized.

In the preferred embodiment of the present invention, the index sequence 10 on the code disc 11 is opaque and the code disc 11 is clear. Conversely, the mask 14 is opaque and the mask sequence 18 is clear. This is illustrated in FIG. 1. This clear-field/opaque-field arrangement has been found to enhance the performance of the detector 16 by permitting the detector photo-transistors to be normally in an "ON", i.e., active, state during substantially all of each revolution of the code disc. Only when the mask sequence 18 and index sequence 10 come into registration will the phototransistors be placed into an off state. As is well known in the art, the response of a phototransistor is fastest when it is already in the active condition, as opposed to moving from an "OFF" to a "ON" condition.

To further enhance the operation of the present invention, a push-pull detection scheme is utilized in the preferred embodiment. As is well known in the art, in push-pull detection the presence or absence of light through a particular code element of mask sequence 18 is detected by a pair of phototransistors, or diodes. The apertures for these devices are positioned so that the dark period for one of the devices corresponds to the light period for the other device. The difference of the outputs of the devices is derived by way of a differential amplifier. Alternatively, push-pull or complementary tracks on the code disc can be used. The push-pull detection described above cancels out common mode signal variations to provide a more stable output signal.

Referring now to FIG. 6a, a number of index sequences are illustrated. These index sequences are formed by using a two element pattern as a building block and spacing each of the blocks at a predetermined distance from the previous block.

In the figure, the left-hand column indicates the number of times the two-element pattern is used. The second column depicts the actual pattern. The third column provides a shorthand representation of the index sequence in terms of the repeated pattern and the spacing between the patterns. The fourth column indicates the maximum amplitude to background noise ratio as well as the total number of incremental units required for the pattern.

With respect to the actual pattern shown, the upper portion of the sequence represents the regions of light and dark which are to be positioned on the code disk, for example, while the lower portion of the sequence illustrates the light and dark portions which are to be positioned on the mask, for example. It is to be understood that this designation is for illustration purposes only, and that the patterns indicated as mask or disk patterns can be interchanged with satisfactory results. Also provided in the "actual sequence" is an indication of the number of incremental spaces between the repeated pattern. Thus, in the first sequence shown in FIG. 6a, there are two incremental spaces between the two-element patterns.

With respect to the third column "shorthand representation", the numbers refer to the incremental spacing between the patterns. The pattern is indicated by an alphabet. In FIG. 6a, the alphabet "x" is used to indicate the two-element pattern. The two-element pattern is defined at the bottom right-hand corner of FIG. 6a. Thus, with respect to the first entry of FIG. 6a the shorthand representation for the index sequence indicates that the two-element pattern is separated by two incremental spaces from the other two-element pattern.

With respect to the "ratio (area)" column it can be seen that, for the first entry of FIG. 6a, the maximum amplitude is four units while the background amplitude is two units. The sequence requires eight incremental units of space. Similarly, for the index sequence in FIG. 6a which utilizes seven two-element patterns, a maximum amplitude of 14 is obtained with a background level of 7. Such a pattern occupies 48 incremental units.

FIG. 6b illustrates the degree of registration obtained from the second index sequence of FIG. 6a. As indicated above, and as can be seen from FIG. 6b, a maximum amplitude of six units is obtained when the patterns are in complete registration with one another. A background level of no more than three units is obtained for all other degrees of registration. It should also be noted that, as is the property described in connection with the two-element pattern alone, a registration waveform is produced in which, for the positions adjacent to the maximum registration position, the waveform is at the maximum background level.

From FIG. 6a it can be seen that the two-element pattern can be repeated in accordance with an incrementaly increasing spacing sequence. Thus, for each additional two-element pattern added to a sequence, said element pattern is spaced by an additional incremental unit than was the spacing for the previous two-element pattern. Thus, for an index sequence having n two-element patterns the spacing between patterns is defined by the series 2, 3, 4, . . . ,n.

It has also been found that the spacing between each two-element pattern need not increase uniformly. To the contrary, it has been found that practically any order of the specified spacing can be used to obtain substantially the same result. Thus, for example, where the two-element pattern is repeated 5 times, the patterns can be spaced according to the sequence 5, 2, 3, 4 or the sequence 2, 5, 3, 4, etc.

Referring now to FIG. 7a, index sequences in which three-element patterns are utilized as building blocks are shown. It has been found that the most efficient sequences are formed by the normal three-element pattern in combination with the three-element pattern in reverse order. In FIG. 7a, the three-element pattern is represented in the shorthand representation by the letter "y". The reverse order three-element pattern is indicated by the "y bar" designation. The actual patterns are defined at the bottom right-hand corner of FIG. 7a. As can be seen from FIG. 7a the spacing between each three-element pattern is not as regular as was the case for the two-element pattern sequences. Thus, for the index sequence which is formed of up to five such three-element patterns, the spacing between patterns is defined by the series 3, 5, 8, and 9.

From the "ratio (area)" column it can be seen that the amplitude versus background ratio obtained when three-element patterns are repeated is, in fact, higher than that obtained when two-element patterns are repeated. However it can also be seen that the index sequences constructed of repeated three-element patterns occupy a greater elemental area. For example, while the index sequence in which the three-element pattern is repeated three times, provides a maximum amplitude of 9 units and a maximum background of 3 units, it occupies 26 incremental units of area. In contrast, an index sequence in which a two-element pattern is repeated 4 times occupies only 21 incremental units of area while providing a maximum amplitude of 8 and a maximum background of 4 units.

Referring now to FIG. 8b an index sequence formed of a four-element pattern which has been repeated twice is shown. From the figure it can be seen that a ratio of 8:2 can be obtained and that the sequence occupies 31 incremental units of area. From FIG. 8b it can be seen that the maximum background level is two units while the maximum level at full registration is 8 units. The letter "z" designates the four-element pattern and the letter "z bar" designates the reverse four-element pattern.

Referring now to FIG. 9, sequence (a), number of sequences are shown in which a mix of patterns is used to form a particular sequence. In FIG. 9, sequence (a), a two-element pattern and a three element pattern are combined to provide a 5:2 ratio and to occupy 11 incremental units.

The sequence in FIG. 9, sequence (b) combines a two-element pattern with a reverse three-element pattern. The ratio obtained is the same as in FIG. 9, sequence (a), but additional area is required for the sequence.

The sequences of FIGS. 9, sequence (c), and 9, sequence (d), combine two-element patterns with a sequence of single-elements. The sequence (c) of FIG. 9 is represented by x-2-x-5-w-2-w and provides a ratio of 6:2 while occupying an area 17 incremental units. The letter "w" designates the single-element pattern.

The sequence (c) of FIG. 9, is expanded in FIG. 9, sequence (d). Here the two-element patterns are separated by an additional incremental unit and the series of single-element patterns are separated, among themselves, by two and three incremental units. The single-element series is separated from the two-element patterns by seven spaces. For such a pattern, a ratio of 7:2 is obtained with an area requirement of 24. This is to be contrasted with the sequence of FIG. 7a in which a three-element pattern is repeated three times. There, a ratio of 9:3 is obtained and an area of 26 incremental units is required.

From the above it is to be appreciated that index sequences can be formed by repeating patterns of elements. Additionally, different patterns, each differing in the number of elements contained, can be combined to form an index sequence. The advantage of using patterns as building blocks is that higher amplitudes can be obtained such that large area sensors can be used efficiently. This is clearly in contrast to the index sequences taught by Wingate in which the longer the sequence the more sparse the spacing of the elements.

In use, the pattern building blocks can be manipulated by the designer so that an acceptable ratio can be obtained in light of the particular sequence length desired. For example, the optimum sequence length can be determined by the resolution of the code disk upon which it is to be positioned as well as the particular sensor which has been chosen for use. At times, the ratio of maximum amplitude to background level can be sacrificed in order to gain efficiency. That is, a smaller ratio might be acceptable in order to obtain a more compact pattern.

It is further to be understood that the building block patterns used can be the conventional Wingate patterns, as well as the modified Wingate patterns discussed above. Further, additional efficiencies of the index sequences can be obtained by using the push-pull techniques discussed above, by using a plurality of optical tracks, and other similar optimizing techniques.

The terms and expressions which have been used herein are terms of description and not of limitation, and there is no intention in the use thereof in limiting the scope of the claims herein or the embodiments shown.

I claim:

1. An encoder for providing positional information about a moveable member comprising code member means couplable to the moveable member for movement with the moveable member;

reference member means positioned to be stationary relative to the code member;

an index sequence positioned at a single zero position on the code member means and on the reference member means comprising a plurality of index patterns, wherein each of the plurality of index patterns comprises a mask component positioned on the reference member means and a corresponding code disk component positioned on the code member means, and wherein for each of the plurality of index patterns the mask component includes a plurality of unit width indicia and the code disk component includes a different plurality of unit width indicia, and further wherein the mask components of each of the plurality of index patterns are separated from one another, and the code disk component of each of the plurality of index patterns are separated from one another, by predetermined spacings; and means for detecting the degree of registration between the mask and code disk components of the index sequence.

2. The encoder of claim 1 wherein the plurality of index patterns comprise a repeated first index pattern.

3. The encoder of claim 2 wherein the mask component of the first index pattern is selected so that, for the zero position of the reference member means, the degree of registration between the code disk component and the mask component is a maximum, and so that for all other positions the degree of registration is no greater than a background level greater than zero.

4. The encoder of claim 2 wherein the mask component of the first index pattern is selected so that, for the zero position of the reference member means and the code member means, the degree of registration between the code disk component and the mask component is at a maximum, and so that for all other positions the degree of registration is no greater than a background level.

5. The encoder of claim 1 wherein the plurality of index patterns include a first index pattern, and a second index pattern in which the unit indicia therein are arranged in reverse order from the unit indicia in the first index pattern.

6. The encoder of claim 5 wherein the first index pattern is repeated in the index sequence.

7. An encoder for providing positional information about a moveable member comprising code member means coupled to the moveable member for movement with the moveable member;

reference member means positioned to be stationary relative to the code member means;

position indicia positioned on the code member means along a position indicia track;

reference indicia positioned on the reference member means along a reference indicia track so that said reference indicia track is in registration with said position indicia track;

means for determining the degree of registration between the reference indicia and the position indicia;

an index sequence positoned at single a zero position on the code member means and reference member means said index sequence including a plurality of the same index pattern, wherein the index pattern comprises a mask component positioned on the reference member means and a code disk component positioned on the code member means, wherein the mask component and the code disk component each include a plurality of unit width indicia, and further wherein the mask components of each of the plurality of the same index pattern are separated from one another, and the code disk components of each of the plurality of the same index pattern, are separated from one another by predetermined spacings; and wherein said determining means further determines the degree of registration between the mask and code disk components of the index sequence.

8. An apparatus for indicating a reference position of a moveable member of the type used in positional encoders said positional encoders including a code member coupled for movement with the moveable member and a reference member which is stationary relative to the moveable member, the apparatus comprising an index sequence positioned about a single point on the code member and the reference member including a plurality of index patterns, wherein each of the plurality of index patterns comprises a mask component positioned on the reference member means and a corresponding code disk component positioned on the code member means, and wherein for each of the plurality of index patterns the mask component includes a plurality of unit width indicia and the code disk component includes a different plurality of unit width indicia, and further wherein the mask components of each of the plurality of index patterns are separated from one another, and the code disk component of each of the plurality of index patterns are separated by predetermined spacings; and detector means for determining the degree of registration between the mask and code disk components of the index sequence.

9. The encoder of claim 2 wherein the code disk component of the first index pattern comprises three abutted indicia and the mask component thereof comprises two indicia spaced apart by a unit length.

10. The encoder of claim 9 wherein the spacings between the index patterns are according to the series of integers 2, 3, 4, 5 . . . , N−1, N, where each integer represents a multiple of a unit space.

11. The encoder of claim 2 wherein the code disk component of the first index pattern comprises three indicia, the first of which is spaced from the other two by two unit widths and the second and third of which are spaced from one another by a unit width, and further wherein the mask component thereof comprises four indicia, the first of which is spaced from the other three by two unit widths and the other three are abutted against each other.

12. The encoder of claim 11 wherein the index patterns are spaced from one another according to the integer series 3, 5, 8, 9, where each integer represents a multiple of a unit space.

13. The encoder of claim 2 wherein the code disk component of the first index pattern comprises four indicia, the first of which is spaced from the second by six unit widths, the second and third of which are spaced from one another by two unit widths, and the fourth of which is spaced from the third by a unit with, and further wherein the mask component thereof comprises five indicia, the first of which is spaced from the second by six unit widths, the second and third of which are separated by two unit widths, and the third, fourth and fifth of which are abutted together.

14. The encoder of claim 13 wherein the index patterns are repeated twice and the spacing between the index patterns is five unit widths.

* * * * *